United States Patent
Lee et al.

(10) Patent No.: US 11,515,443 B2
(45) Date of Patent: Nov. 29, 2022

(54) TANDEM SOLAR CELL MANUFACTURING METHOD

(71) Applicant: LG ELECTRONICS INC., Seoul (KR)

(72) Inventors: Yu Jin Lee, Seoul (KR); Seongtak Kim, Seoul (KR); Seh-Won Ahn, Seoul (KR); Jin-Won Chung, Seoul (KR)

(73) Assignee: Shangrao Jinko solar Technology Development Co., LTD

( * ) Notice: Subject to any disclaimer, the term of this patent is extended or adjusted under 35 U.S.C. 154(b) by 63 days.

(21) Appl. No.: 16/982,391

(22) PCT Filed: Mar. 18, 2019

(86) PCT No.: PCT/KR2019/003147
§ 371 (c)(1),
(2) Date: Sep. 18, 2020

(87) PCT Pub. No.: WO2019/182316
PCT Pub. Date: Sep. 26, 2019

(65) Prior Publication Data
US 2021/0005832 A1    Jan. 7, 2021

(30) Foreign Application Priority Data

Mar. 19, 2018  (KR) ........................ 10-2018-0031720

(51) Int. Cl.
*H01L 31/18* (2006.01)
*H01L 31/0725* (2012.01)
(Continued)

(52) U.S. Cl.
CPC .......... *H01L 31/1804* (2013.01); *H01G 9/20* (2013.01); *H01L 21/30604* (2013.01);
(Continued)

(58) Field of Classification Search
CPC .......... H01L 51/4213; H01L 21/30604; H01L 27/302; H01L 31/0687; H01L 31/0725;
(Continued)

(56) References Cited

U.S. PATENT DOCUMENTS 9,240,504 B2 * 1/2016 Ohbo ................ H01L 31/02366
9,583,652 B2 * 2/2017 Lachowicz ....... H01L 31/02363
(Continued)

FOREIGN PATENT DOCUMENTS

CN    105609594 A * 5/2016  ....... H01L 31/02363
CN    107431099 A * 12/2017  ....... H01L 31/02363
(Continued)

*Primary Examiner* — Earl N Taylor
(74) *Attorney, Agent, or Firm* — Tucker Ellis LLP

(57) ABSTRACT

Discussed is a tandem solar cell manufacturing method including etching a crystalline silicon substrate, whereby a solar cell can be obtained which does not have a pyramid-shaped defect on a surface of the substrate, inhibits the generation of a shunt through the substrate having excellent surface roughness properties, and can secure fill factor properties, the solar cell being capable of being obtained through the tandem solar cell manufacturing method. The method includes preparing a crystalline silicon substrate; performing an isotropic etching process of the substrate; and removing a saw damage on a surface of the substrate by performing an anisotropic etching process of the isotropically etched substrate.

18 Claims, 22 Drawing Sheets

(51) Int. Cl.
*H01L 31/0687* (2012.01)
*H01L 27/30* (2006.01)
*H01L 21/306* (2006.01)
*H01L 31/0747* (2012.01)
*H01G 9/20* (2006.01)
*H01L 31/20* (2006.01)

(52) U.S. Cl.
CPC ........ *H01L 27/302* (2013.01); *H01L 31/0687* (2013.01); *H01L 31/0725* (2013.01); *H01L 31/0747* (2013.01); *H01L 31/186* (2013.01); *H01L 31/208* (2013.01)

(58) Field of Classification Search
CPC . H01L 31/186; H01L 31/208; H01L 31/0747; H01L 51/0096; H01L 31/1804; H01L 31/18; H01L 31/0376; H01G 9/20; Y02E 10/547; Y02E 10/544; Y02E 10/549; Y02E 10/50; Y02P 70/50
See application file for complete search history.

(56) References Cited

U.S. PATENT DOCUMENTS

| | | | | |
|---|---|---|---|---|
| 2009/0280597 | A1* | 11/2009 | Wijekoon | H01L 31/02363 156/345.16 |
| 2012/0015470 | A1* | 1/2012 | Nishimura | H01L 31/02363 257/E31.13 |
| 2012/0111396 | A1* | 5/2012 | Saylor | H01L 31/068 257/E31.13 |
| 2012/0288985 | A1* | 11/2012 | Moriceau | H01L 31/075 438/96 |
| 2014/0209165 | A1* | 7/2014 | Ohbo | H01L 31/18 438/98 |
| 2015/0249170 | A1* | 9/2015 | Snaith | H01L 51/4226 136/265 |
| 2016/0072003 | A1* | 3/2016 | Kohata | H01L 31/1868 438/71 |
| 2016/0322172 | A1* | 11/2016 | Chaudhari | H01L 51/4213 |
| 2018/0019358 | A1* | 1/2018 | Ahn | H01L 27/302 |
| 2018/0166504 | A1* | 6/2018 | Kamino | H01L 51/442 |
| 2018/0259990 | A1* | 9/2018 | Pellet | H01L 31/0687 |
| 2018/0351123 | A1* | 12/2018 | Saliba | H01L 51/447 |
| 2020/0058819 | A1* | 2/2020 | Kirner | H01L 31/022466 |
| 2020/0176618 | A1* | 6/2020 | Ahn | H01L 31/022425 |
| 2021/0082634 | A1* | 3/2021 | Lee | H02S 30/10 |
| 2021/0126147 | A1* | 4/2021 | Lee | H01L 31/186 |

FOREIGN PATENT DOCUMENTS

| | | | |
|---|---|---|---|
| DE | 10 2015 015 017 A1 | 5/2017 | |
| KR | 10-2012-0104441 A | 9/2012 | |
| KR | 10-2014-0014065 A | 2/2014 | |
| KR | 10-2018-0007585 A | 1/2018 | |
| WO | WO 2013/098955 A1 | 7/2013 | |
| WO | WO-2013098955 A1 * | 7/2013 | ....... H01L 31/02366 |
| WO | WO-2013111312 A1 * | 8/2013 | ....... H01L 31/03529 |
| WO | WO 2015/033193 A1 | 3/2015 | |
| WO | WO-2015033193 A1 * | 3/2015 | ........... C23C 16/402 |
| WO | WO-2018221914 A1 * | 12/2018 | ........... H01G 9/2009 |

* cited by examiner

| ALKALI 5 MINUTES + ACID 10 MINUTES | ALKALI 10 MINUTES + ACID 10 MINUTES |
|---|---|
|  |  |
|  |  |

# TANDEM SOLAR CELL MANUFACTURING METHOD

CROSS REFERENCE TO RELATED APPLICATIONS

This application is the National Stage filing under 35 U.S.C. 371 of International Application No. PCT/KR2019/003147 filed on Mar. 18, 2019, which claims priority to Korean Patent Application No. 10-2018-0031720, filed on Mar. 19, 2018, the entire contents of all these applications are hereby expressly incorporated by reference into the present application.

TECHNICAL FIELD

The present disclosure relates to a method for manufacturing a tandem solar cell using a method of etching a crystalline silicon substrate.

BACKGROUND ART

A crystalline silicon (c-Si) solar cell is a representative single junction solar cell and is widely used as a commercial solar cell.

However, a tandem solar cell constituting one solar cell by connecting single junction solar cells including absorption layers having different band gaps has been actively developed due to a low photoelectric conversion efficiency of the crystalline silicon solar cell.

FIG. 1 is a schematic cross-sectional view showing a two-terminal tandem solar cell among tandem solar cells.

Referring to FIG. 1, the solar cell includes a single junction solar cell including an absorption layer having a relatively large band gap and a single junction solar cell including an absorption layer having a relatively small band gap and they are bonded through a middle layer.

Among them, perovskite/crystalline silicon tandem solar cells may use a single junction solar cell including the absorption layer having the relatively large band gap as a perovskite solar cell to achieve 30% or more of high-photoelectric efficiency, and thus, perovskite/crystalline silicon tandem solar cells draw attention.

Crystalline silicon solar cells and tandem solar cells in related art each use a crystalline silicon substrate.

For economic reason, the crystalline silicon substrate for the solar cell has 5 to 6 N of chemical purity (corresponding to 99.999 to 99.9999% of purity) that is lower than 10 to 11 N of chemical purity of a semiconductor crystalline silicon substrate. Furthermore, a surface of a single crystal silicon ingot or a polycrystalline silicon ingot for solar cells is cut into wafers by a saw wire and the cut wafers are supplied without post-processing.

The silicon substrate supplied by cutting with the saw wire has greater surface roughness or saw mark of several to tens of μm and has severe damage and contamination on the surface thereof. Therefore, an alkali or acid-based subsequent etching process is performed to remove the defects or the contamination. The etching is referred to as "saw damage etching (SDE)". After the SDE process, a texture is selectively formed on the surface of a flat crystalline silicon substrate through a texturing process to increase a path of sunlight.

As shown in FIG. 2, after the SDE process in the related art, a plurality of pyramid-shaped defects having a width and a height of several μm are present on the crystalline silicon substrate. Even if the SDE is repeatedly performed, the detects are not removed, but are still present.

For the crystalline silicon solar cell or the tandem solar cell including the same in the related art, even if the pyramid-shaped defects are present after the SDE, the texture of several to tens of μm is formed on the substrate surface by the subsequent texturing process, and thus, the pyramid-shaped defects are screened by the texture.

For example, when a perovskite solar cell is formed on the textured silicon substrate, unit layers of the perovskite solar cell formed on the texture have a thickness of tens to hundreds of nm.

If the texture is formed on the substrate, the texture of the substrate is projected to the unit layer, and thus, the unit layer has the texture. This is referred to as "conformal structure" or "conformal growth". In the conformal structure of the crystalline silicon substrate having the texture in the related art, there is a problem in that the unit layers of the perovskite solar cell are not uniformly coated by the texture disposed thereunder.

Therefore, the crystalline silicon substrate may be flattened by the SDE to form the tandem solar cell including the perovskite solar cell with the uniform unit layer.

As described above, however, the crystalline silicon substrate by SDE in the related art has pyramid-shaped defects with the size of several μm even after the etching. The pyramid-shaped defects have the size greater than tens to hundreds of nm, which is a thickness of the unit layer of the perovskite solar cell. Therefore, when the pyramid-shaped defects are present on the flat substrate surface, the perovskite solar cell may have difficulty in forming a unit layer having a uniform thickness and composition.

Further, the pyramid-shaped defects cause a shunt on the perovskite cell surface, thereby degrading fill factor (FF) characteristics.

DISCLOSURE

Technical Problem

The present disclosure provides a method of etching a substrate that has no pyramid-shaped defects on a surface of a crystalline silicon substrate, having excellence in surface roughness characteristics caused by a saw mark, and with no surface damage.

The present disclosure also provides a method of etching a substrate and a method for manufacturing a solar cell. The methods may be used to manufacture a unit layer having a uniform thickness and composition when the perovskite unit layer is deposited by removing pyramid-shaped defects from the surface of a crystalline silicon substrate and improving surface roughness caused by the saw mark.

The present disclosure further provides a method of etching a substrate capable of suppressing shunts caused by non-uniform deposition of the perovskite unit layer. The present disclosure further provides the solar cell using the substrate to obtain fill factor characteristics.

Technical Solution

To provide a solar cell capable of suppressing shunt and obtaining fill factor characteristics by manufacturing a uniform unit layer of a solar cell using a substrate with no pyramid-shaped defects on a surface thereof, having excellence in surface roughness caused by a saw mark, and with no surface damage, according to the present disclosure, there may be provided a method for manufacturing a tandem solar cell. The method for manufacturing the tandem solar cell includes preparing a crystalline silicon substrate; isotropic etching the substrate; removing saw damage on a surface of the substrate by anisotropic etching the isotropically etched substrate; positioning a second solar cell on the substrate from which the saw damage is removed; positioning a middle layer on the second solar cell; and positioning a first solar cell on the middle layer.

Preferably, there may be provided the method for manufacturing the tandem solar cell characterized in that the isotropic etching is performed using an acid.

In this case, there may be provided the method for manufacturing the tandem solar cell characterized in that the acid is a mixed acid with nitric acid ($HNO_3$) and hydrofluoric acid (HF) and has a mixing ratio of 100:1 to 10:1.

Preferably, there may be provided the method for manufacturing the tandem solar cell characterized in that the anisotropic etching is performed using an alkali.

In this case, there may be provided the method for manufacturing the tandem solar cell characterized in that the alkali is 1 to 10% by weight of sodium hydroxide aqueous solution.

In particular, there may be provided the method for manufacturing the tandem solar cell characterized in that the etching solution further includes at least one additive of an organic solvent, a phosphate, a reaction modifier, or a surfactant.

Preferably, there may be provided the method for manufacturing the tandem solar cell characterized in that the method for manufacturing the tandem solar cell further includes the isotropic etching process after the anisotropic etching process. Preferably, there may be provided the method for manufacturing the tandem solar cell characterized in that the anisotropic etching process time is 5 to 10 minutes.

Preferably, there may be provided the method for manufacturing the tandem solar cell characterized in that the second solar cell is disposed on a flat substrate where the saw damage is removed and with no texture.

Preferably, there may be provided the method for manufacturing the tandem solar cell characterized in that the first solar cell has a greater band gap than a band gap of the second solar cell.

In this case, there may be provided the method for manufacturing the tandem solar cell characterized in that the first solar cell is a perovskite solar cell and the second solar cell is a crystalline silicon solar cell.

In particular, there may be provided the method for manufacturing the tandem solar cell characterized in that the second solar cell includes a first semiconductor type layer and a second semiconductor type layer; and at least one of the first semiconductor type layer or the second semiconductor type layer includes an amorphous silicon layer.

Advantageous Effects

According to the present disclosure, a crystalline silicon substrate with no pyramid-shaped surface detects may be obtained by isotropic etching and anisotropic etching of a substrate etching method.

In addition, according to the present disclosure, a crystalline silicon substrate with no damage caused by saw mark and having excellent surface roughness characteristics may be provided through the etching method.

A unit layer having a uniform thickness and composition and without defects may be formed according to conformal characteristics of the unit layer of the perovskite solar cell.

According to the present disclosure, shunt generated when the uneven unit layer is formed may be prevented through the substrate etching method. Therefore, according to the present disclosure, the solar cell using the substrate etched through the etching method may obtain excellent fill factor characteristics and efficiency.

BEST MODE

Figure 1:
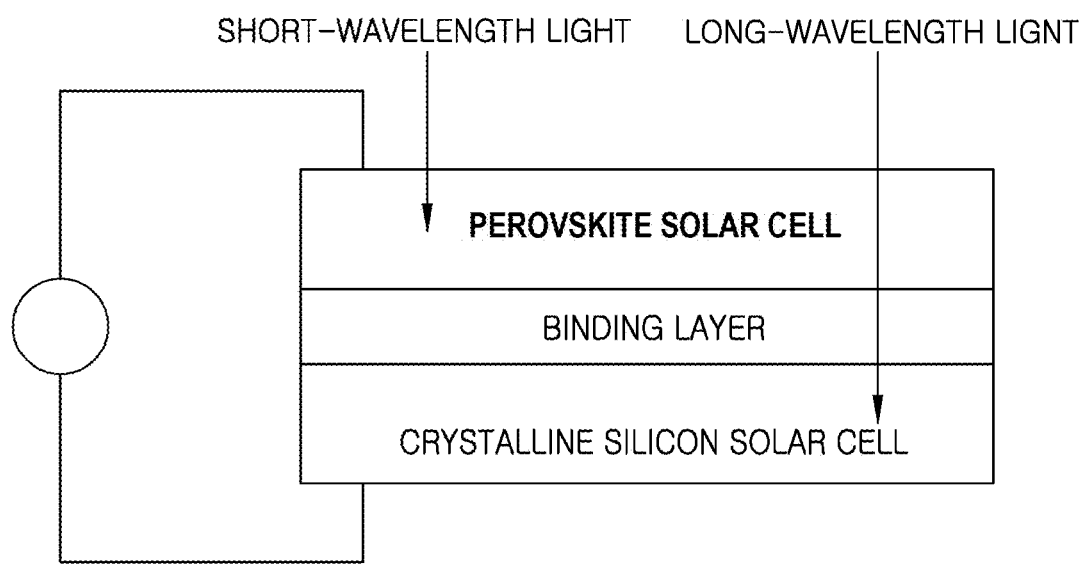
FIG. 1 is a schematic cross-sectional view showing a monolithic, two-terminal tandem solar cell among tandem solar cells.
Figure 2:
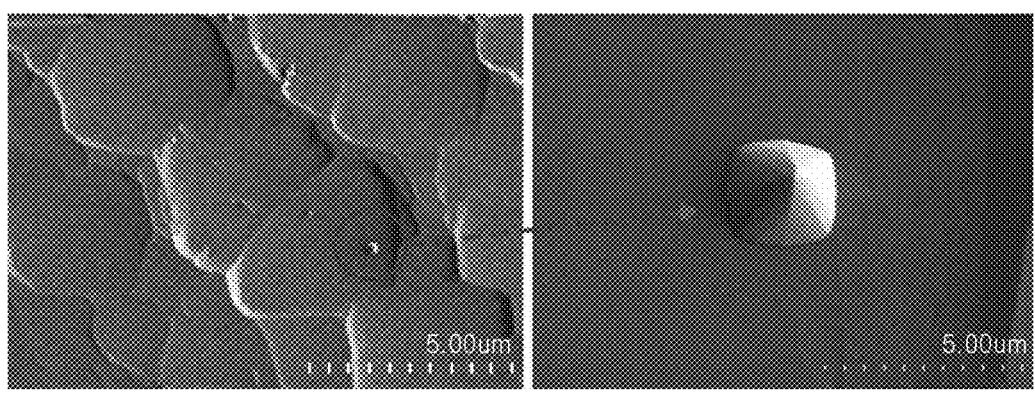
FIG. 2 shows a microscope picture of a pyramid-shaped defects presenting on a surface of a crystalline silicon substrate after saw damage etching (SDE) in related art.

Hereinafter, a tandem solar cell and a method for manufacturing the same according to embodiments of the present disclosure are described with reference to accompanying drawings.

The present disclosure is not limited to the embodiments disclosed below, but may be implemented in various manners, and these embodiments are provided so that this disclosure will be thorough and complete, and will fully convey the scope of the disclosure to those skilled in the art.

A detailed description not relating to the present disclosure may be omitted to clearly describe the present invention and same reference numerals are used through the disclosure to designate the same or similar components. In addition, example embodiments will be described in detail with reference to the attached drawings. Reference now should be made to the drawings, in which the same reference numerals are used throughout the different drawings to designate the same or similar components. A detailed description of a well-known configuration or function relating to the present disclosure may be omitted if it unnecessarily obscures the gist of the present disclosure.

In some examples, terms such as first, second, A, B, (a), (b) and the like may be used herein when describing elements of the present disclosure. These terms are intended to distinguish one element from other elements, and the essence, order, sequence, or a number of corresponding elements are not limited by these terms. It should be noted that if it is described in the present disclosure that one component is "connected," "coupled" or "joined" to another component, the former may be directly "connected," "coupled" or "joined" to the latter, or another component may be disposed between the former and the latter, or the former may be "connected," "coupled" or "joined" to the latter via another component.

In some examples, for convenience of description, one element may be described as its sub-elements in implementing the present disclosure; however, the sub-elements may be implemented in a single device or module in an integrated manner or implemented in multiple devices or modules in a distributed manner.

[Method of Etching Crystalline Silicon Substrate]

Figure 3:
FIG. 3 is a cross-sectional view showing a crystalline silicon substrate 111 having a flat first surface and second surface according to the present disclosure.

FIG. 3 is a cross-sectional view showing a crystalline silicon substrate 111 used in the present disclosure.

As shown in FIG. 3, a first surface and a second surface of the crystalline silicon substrate 111 of the present disclosure are flattened by an etching method in the present disclosure. For example, the crystalline silicon substrate 111 of the present disclosure having the cross-section in FIG. 3 does not have pyramid-shaped defects on the surface thereof 111 and has an excellent surface roughness, as shown in FIG. 4.

Figure 4:
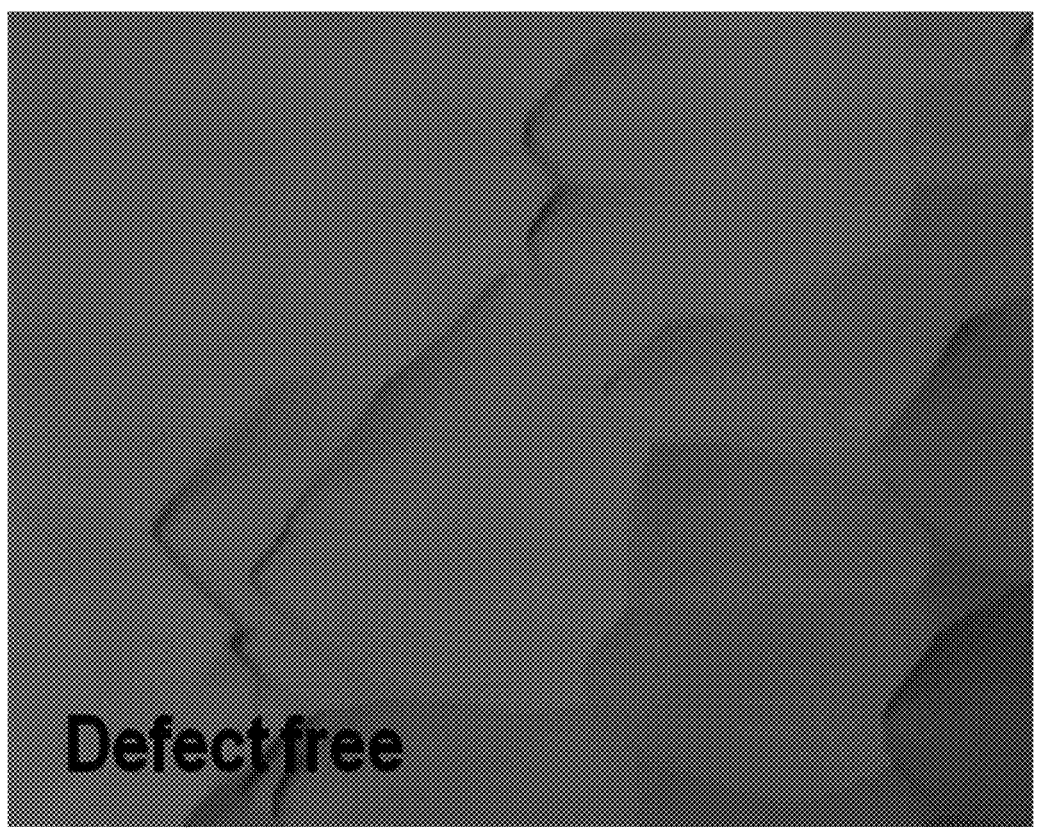
FIG. 4 shows a microscope picture of a surface of a crystalline silicon substrate according to the present disclosure, which has excellent surface roughness and with no pyramid-shaped defects.
Figure 5:
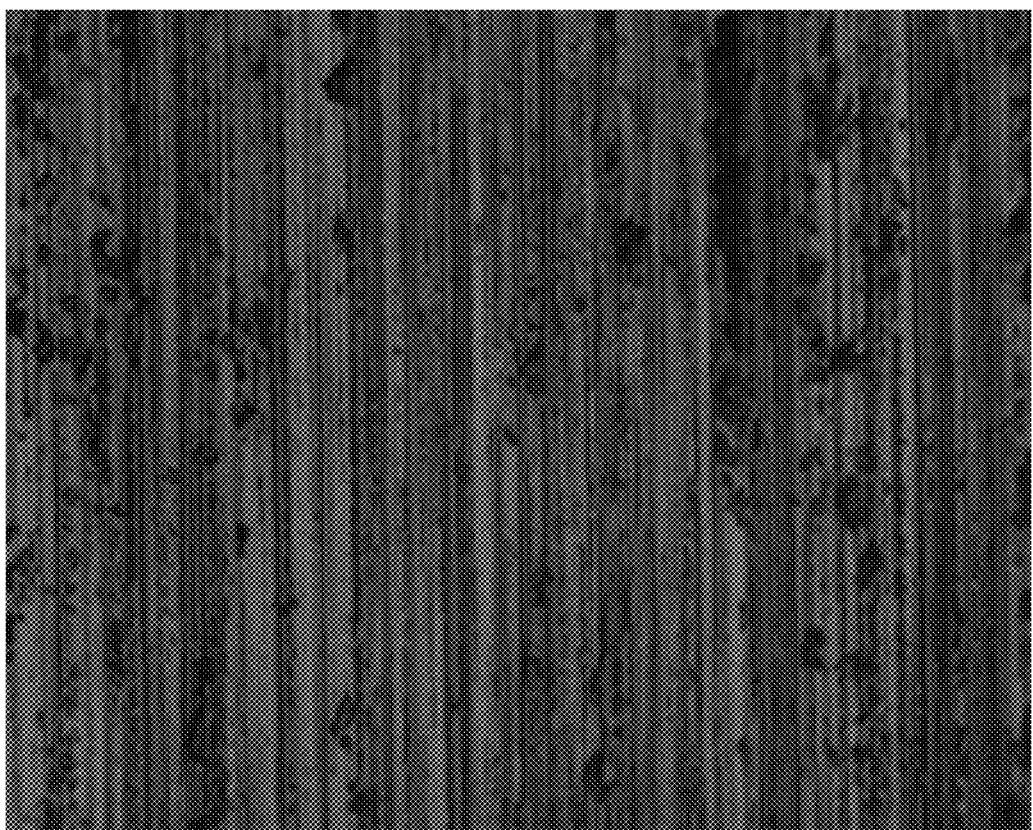
FIG. 5 shows a microscope picture of a bare wafer processed by cutting using a wire saw.

The crystalline silicon substrate of the present disclosure having the surface in FIG. 4 is formed from a bare wafer in FIG. 5.

As described above, a bare wafer in FIG. 5 is processed by cutting a silicon wafer having 5 to 6N of purity by a wire saw. In this case, as shown in FIG. 5, the bare wafer is severely contaminated on the surface thereof due to foreign substrates and has a severe damage mark on the wafer surface generated when it is cut using the saw and a severe surface roughness.

Therefore, as the bare wafer itself may not be used as the crystalline silicon substrate 111 for the solar cell, a subsequent process including pre-cleaning and etching may be used. The above etching is referred to as "saw damage etching (SDE)" for removing the wafer damaged by the wire saw.

Two types of SDE methods are known for a crystalline silicon wafer.

Among the SDE methods, an anisotropic etching method is a method of etching at a temperature near room temperature using an alkaline aqueous solution. For example, the anisotropic etching method is a method of etching a substrate surface using 1 to 10% by weight of sodium hydroxide (NaOH) aqueous solution or potassium hydroxide (KOH) aqueous solution and an aqueous solution containing additives of organic solvents, phosphates, reaction modifiers, and/or surfactants in a temperature range of room temperature to 150° C.

There is a problem in that, if sodium hydroxide has a concentration less than 1% by weight, an etching rate thereof is too slow and productivity thereof is lowered.

There is a problem in that, if sodium hydroxide has a concentration greater than 10% by weight, an etching rate thereof is too fast, a thickness of the substrate is easily thinned, and damage such as etch pit may occur on the substrate surface.

Through the anisotropic etching, a chemically stable {111} plane has a lowest etching rate at the silicon wafer substrate surface. As a result, after the anisotropic etching, the silicon substrate surface has an increased ratio of {111} plane and has improvement in surface roughness caused by the wire saw.

There is isotropic etching as opposed to the anisotropic etching.

The isotropic etching is a method of etching a temperature near room temperature using an acid as an etching solution. For example, the isotropic etching is the method of etching the substrate surface using a mixed acid as a mixture of nitric acid and hydrofluoric acid and an aqueous solution containing an additive.

In this case, a weight ratio of nitric acid to hydrofluoric acid is preferably 100:1 to 10:1.

If the hydrofluoric acid has a lower ratio compared to a ratio of nitric acid to hydrofluoric acid of 100:1 (or the nitric acid has a high ratio), the etching rate is too fast and the substrate thickness is excessively thinned, and thus, there is a risk that the substrate may be destroyed upon the subsequent process and there is a problem in that process costs increase due to an increase in amount of solution used.

For example, there is a problem in that, if the hydrofluoric acid has a high ratio than 10:1 (or when the nitric acid has a low ratio), the etching process time significantly increases and the {111} plane is not properly etched compared to the {100} plane, thereby remaining a peak shape.

The substrate on the silicon wafer surface is uniformly etched through the isotropic etching regardless of crystallographic orientation of the substrate. When the isotropic etching is performed, the silicon substrate surface is uniformly etched, and thus, the surface roughness is improved and a sharp concave-convex shape thereof is rounded through the uniform etching.

In the present disclosure, there is provided the method of etching the crystalline silicon substrate capable of completely removing the pyramid-shaped defects by adjusting the etching method and the combination thereof with the bare wafer having the purity of 5N to 6N as a starting material.

Comparative Example 1

In Comparative Example 1, among the SDE methods described above, only anisotropic etching using an aqueous alkali solution was repeated once or multiple times or an etching time was increased.

Figure 6:
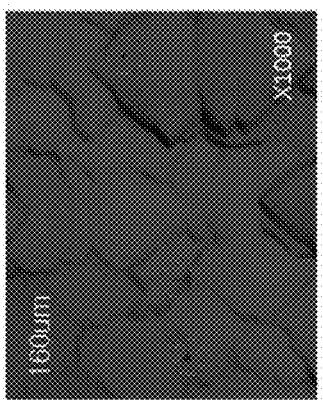
FIG. 6 shows a microscope picture in Comparative Example 1 in which a bare wafer was pre-cleaned for 10 minutes and then anisotropically etched at room temperature.
Figure 6:
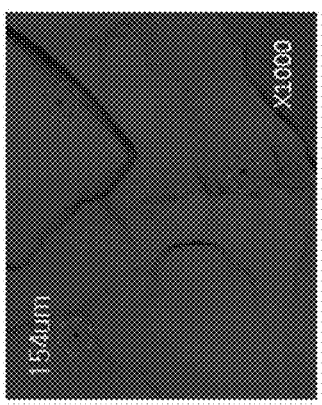
Figure 6:
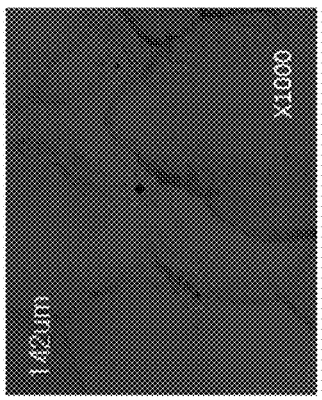
Figure 6:
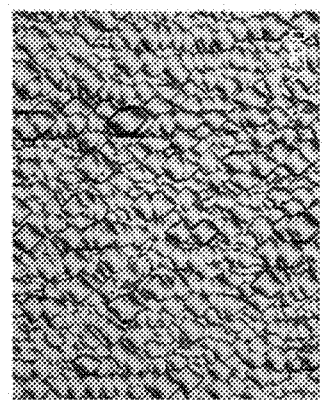
Figure 6:
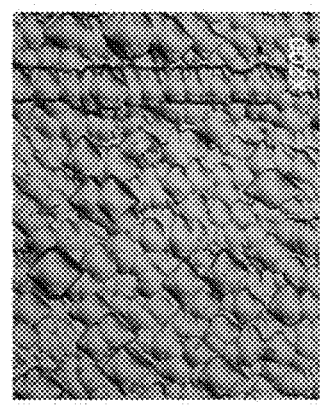
Figure 6:
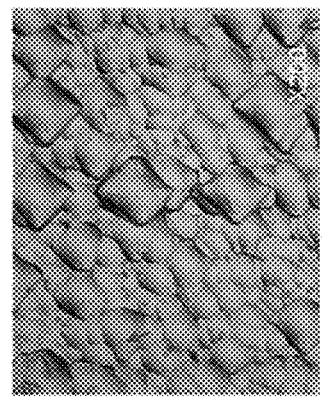

FIG. 6 shows a picture of a microstructure in Comparative Example 1 in which a bare wafer was pre-cleaned for 10 minutes and anisotropically etched using 5% by weight of sodium hydroxide (NaOH) aqueous solution at room temperature.

Anisotropic etching is an etching method using a phenomenon in which an etching rate varies depending on a surface crystallographic orientation of a crystalline silicon substrate. In this case, surfaces with crystallographic orientations each different from that of a chemically stable {111} plane has a faster etching rate than that of the {111} plane due to crystallographic or atomic bond instability. As a result, after etching, other surfaces are etched, removed, and the {111} plane mainly remains on the crystalline silicon substrate. That is, the anisotropic etching has a feature in that the etching rate thereof is faster than that of the isotropic etching.

As shown in FIG. 6, it may be seen that as the etching time elapses, surface roughness on the bare wafer is slightly improved and the sharp concave-convex shape on the bare wafer is slightly rounded, but the surface roughness is not significantly improved. It was also founded that, as the etching time elapses, a number of pyramid-shaped defects presenting on the surface tended to decrease, but they are still present on the surface of the crystalline silicon wafer regardless of etching time.

It was found that, among the generally-known SDE methods, the anisotropic etching method failed to remove the pyramid-shaped defects from the surface of the crystalline silicon wafer regardless of the etching time and a number of etchings. For this reason, the crystalline silicon substrate in Comparative Example 1 of the present disclosure is not suitable for forming a unit layer having a uniform thickness and composition when the unit layer of a perovskite solar cell is deposited as a subsequent process.

Comparative Example 2

In Comparative Example 2, only isotropic etching using an acidic solution among the SDE methods described above was repeated once or multiple times or an etching time was increased.

Figure 7:
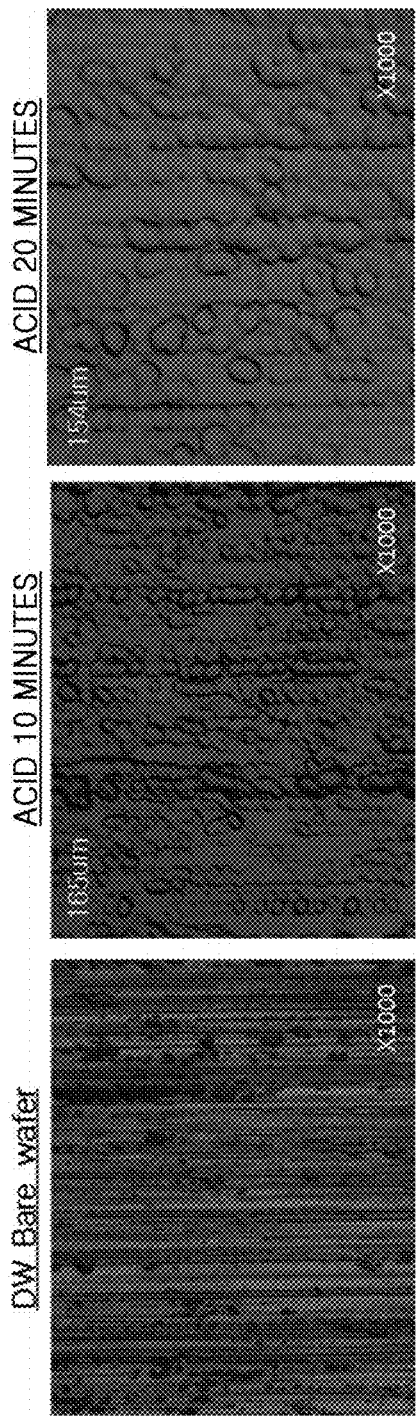
FIG. 7 shows a microscope picture in Comparative Example 2 in which a bare wafer was pre-cleaned for 10 minutes and then isotropically etched at room temperature.

FIG. 7 shows a picture of a microstructure in Comparative Example 2 in which a bare wafer was pre-cleaned for 10 minutes, and isotropically etched at room temperature with a ratio of nitric acid ($HNO_3$) to hydrofluoric acid (HF) adjusted to 20:1.

As shown in FIG. 7, it may be seen that, as the etching time elapses, a stepped portion caused by the saw mark on the bare wafer slightly decreases, but it is still present.

However, isotropic etching has an effect of rounding a sharp cross-section or surface caused by a saw mark because the isotropic etching is performed in all directions regardless of crystallographic orientation on the wafer surface. For this reason, as described above, the isotropic etching has a feature that the etching rate thereof is slower than that of the anisotropic etching.

For example, pyramid-shaped defects do not occur on the surface of the crystalline silicon wafer subjected to isotropic etching.

Therefore, it may be seen that, for the isotropic etching among the generally-known SDE methods, pyramid-shaped defects are not provided on the surface of the crystalline silicon substrate regardless of the etching time and a number of etching, but the stepped portion caused by the saw mark is not removed through the isotropic etching. For this reason, it is expected that the crystalline silicon substrate in Comparative Example 2 of the present disclosure is not advantageous to form a unit layer having a uniform thickness and composition when the unit layer of the perovskite solar cell is deposited.

Comparative Example 3

In Comparative Example 3 of the present disclosure, a mixed etching method was performed in which anisotropic etching using an aqueous alkali solution was performed among the SDE methods described above, and then isotropic etching is performed using an aqueous acid solution.

Figure 8:
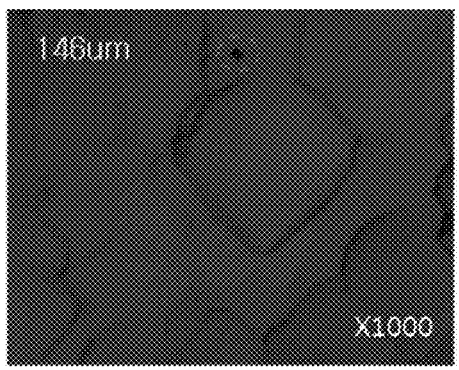
FIG. 8 shows a microscope picture in Comparative Example 3 in which a bare wafer was pre-cleaned for 10 minutes, anisotropically etched at room temperature, and then isotropically etched.
Figure 8:
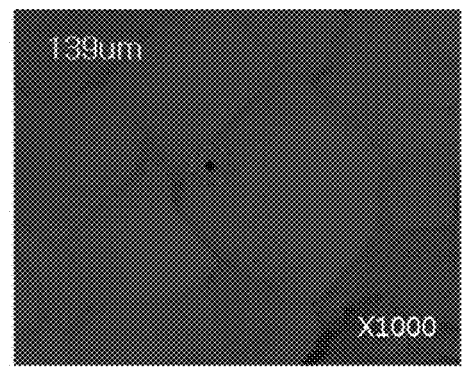
Figure 8:
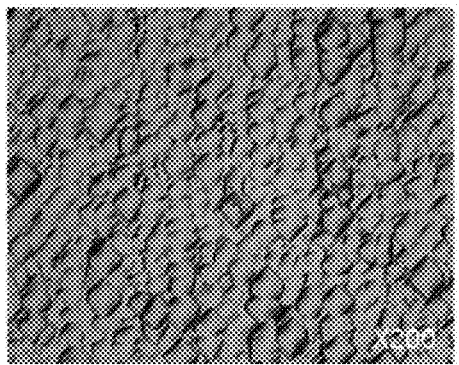
Figure 8:
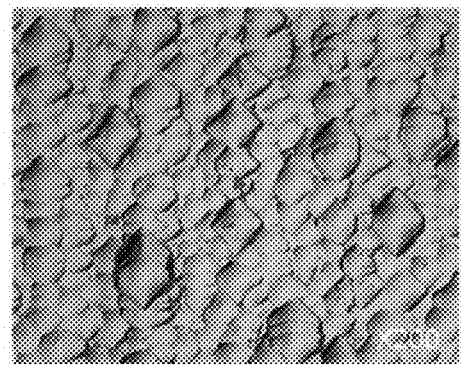

FIG. 8 shows a picture of a microstructure in Comparative Example 3 in which a bare wafer was pre-cleaned for 10 minutes, anisotropically etched in 5% by weight of sodium hydroxide (NaOH) aqueous solution at room temperature for 5 minutes and 10 minutes, respectively, and isotropically etched for 10 minutes with a ratio of nitric acid ($HNO_3$) to hydrofluoric acid (HF) adjusted to 20:1.

As shown in FIG. 8, a stepped portion caused by a saw mark on the bare wafer was reduced by the anisotropic etching. However, even if the subsequent isotropic etching is performed, it was found that pyramid-shaped defects were present on the surface of the final crystalline silicon substrate. In addition, even if the anisotropic etching time was increased from 5 minutes to 10 minutes, the pyramid-shaped defects were still present on the surface of the final crystalline silicon substrate.

There is a problem in that, when the anisotropic etching time is increased from 5 minutes to 10 minutes, a thickness of the substrate is reduced to 140 μm or less due to the fast etching rate of the anisotropic etching, and thus, the substrate may have difficulty in handling.

Therefore, the saw marks on the surface of the crystalline silicon substrate were slightly removed, but the pyramid-shaped defects were not completely removed from the substrate surface through the etching method in Comparative Example 3 in which the anisotropic etching is performed, and then, the isotropic etching is performed. For this reason, the crystalline silicon substrate in Comparative Example 3 of the present disclosure is also not advantageous to form the unit layer having the uniform thickness and composition when a unit layer of a perovskite solar cell is deposited as the subsequent process.

Embodiment 1

In contrast to Comparative Example 3 described above, in Embodiment 1 of the present disclosure, an isotropic etching using an aqueous alkali acid solution among the SDE methods described above was performed, and then, an anisotropic etching method using an aqueous alkali solution was performed.

Figure 9:
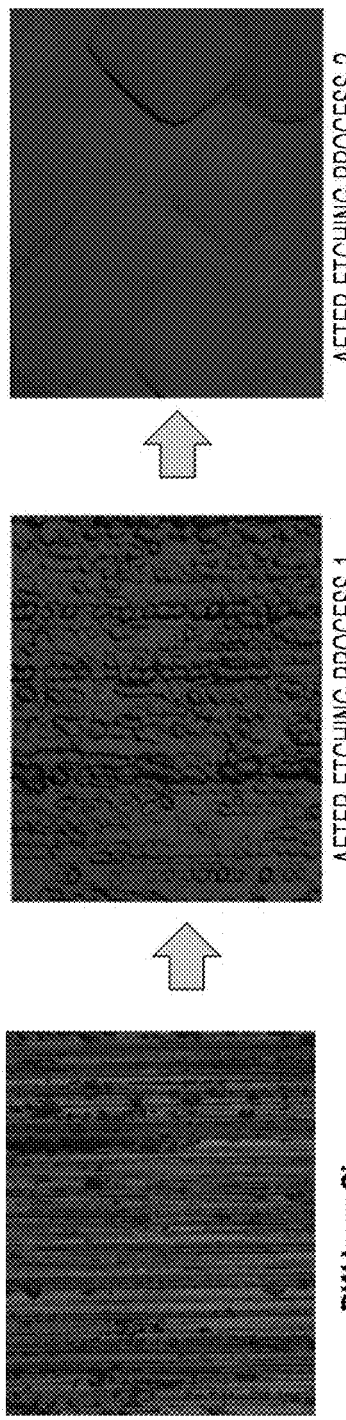
FIG. 9 shows a microscope picture in Embodiment 1 in which a bare wafer was pre-cleaned for 10 minutes, isotropically etched at room temperature, and then anisotropically etched.

FIG. 9 shows a picture of a microstructure in Embodiment 1 in which a bare wafer was pre-cleaned for 10 minutes, isotropically etched for 10 minutes at room temperature with a ratio of nitric acid ($HNO_3$) to hydrofluoric acid (HF) adjusted to 20:1, and anisotropically etched for 5 minutes in a 5% by weight of sodium hydroxide (NaOH) aqueous solution.

As shown in FIG. 9, a stepped portion caused by a saw mark on the bare wafer was not significantly reduced by isotropic etching, but a sharp cross-section or surface was not observed because the isotropic etching is performed in all directions regardless of crystallographic orientations on wafer surfaces to have a surface-rounding effect.

Subsequently, when the anisotropic etching is performed, it may be seen that the stepped portion (or the surface roughness) due to the saw mark on the wafer is greatly reduced as shown in FIG. 9. Furthermore, no pyramid-shaped defects were observed on the surface of the final crystalline silicon substrate after the anisotropic etching.

The etching time of the subsequent anisotropic etching is advantageous not to exceed 10 minutes. If the anisotropic etching time exceeds 10 minutes, the substrate may be significantly thinned due to the fast etching rate of the anisotropic etching.

In conclusion, the etching method in Embodiment 1 in which the isotropic etching is performed and then the anisotropic etching is performed may be used to improve flatness by removing saw marks on the surface of the crystalline silicon substrate and completely removes the pyramid-shaped defects from the substrate surface. Therefore, the crystalline silicon substrate according to Embodiment 1 of the present disclosure is expected to improve solar cell panel characteristics by enabling the formation of the unit layer having the uniform thickness and composition when the unit layer of the perovskite solar cell is subsequently deposited.

Embodiment 2

Isotropic etching was added in a last step of SDE in Embodiment 2 of the present disclosure, compared to Embodiment 1 of the present disclosure.

Figure 10:
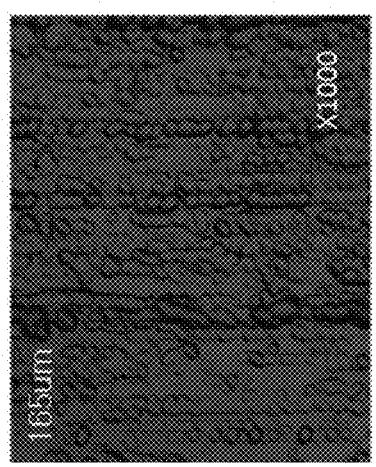
FIG. 10 shows a microscope picture in Embodiment 2 in which a bare wafer was pre-cleaned for 10 minutes, isotropically etched at room temperature, and then anisotropically etched and isotropically etched again.
Figure 10:
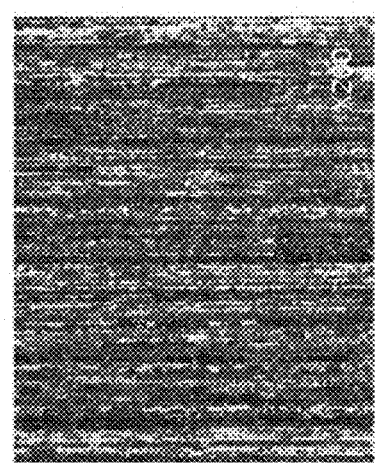
Figure 10:
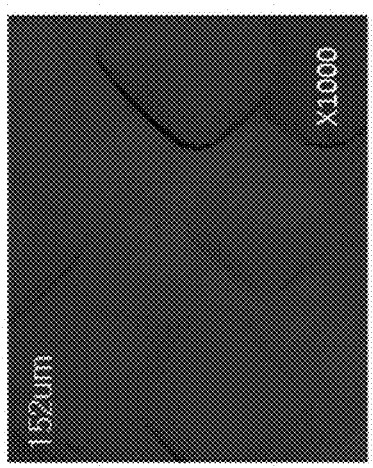
Figure 10:
Figure 10:
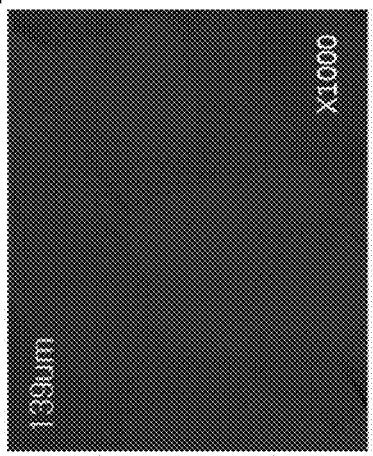
Figure 10:
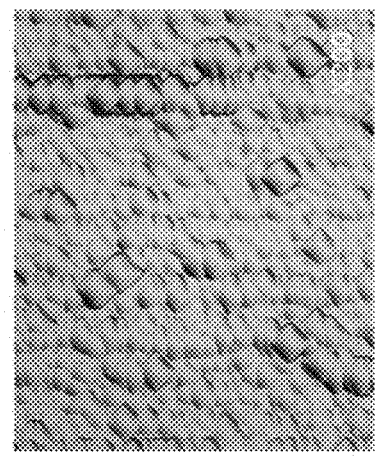

As shown in FIG. 10, the saw mark was removed from the surface of the crystalline silicon substrate subjected to the isotropic etching and the anisotropic etching in Embodiment 1 and no pyramid defects were present.

In Embodiment 2 in which the isotropic etching was further performed for 10 minutes thereafter, it may be seen that the final substrate has a surface-rounding shape by the last isotropic etching to improve surface roughness and smoothen curve.

Figure 11:
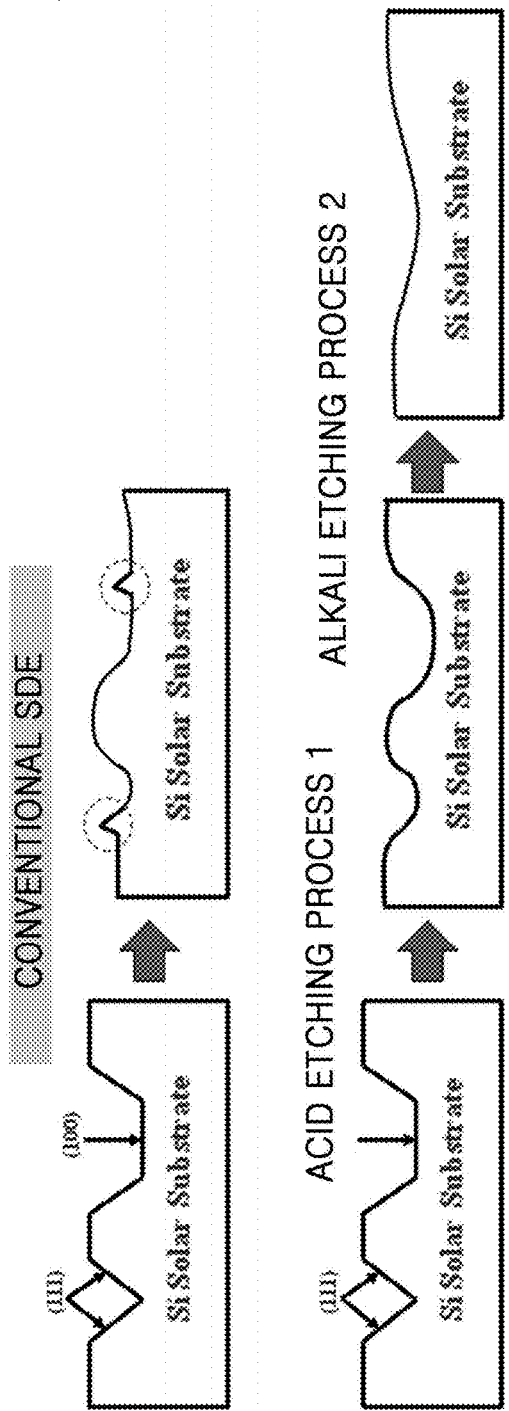
FIG. 11 is a schematic view showing a mechanism for forming a surface state of a crystalline silicon substrate by SDE in Embodiments and Comparative Examples of the present disclosure.

FIG. 11 shows a mechanism in which a surface of a crystalline silicon substrate is formed by etching in Embodiments and Comparative Examples of the present disclosure, estimated by the present inventors.

A bare silicon substrate cut by a wire saw has saw marks on a substrate surface as shown in FIG. 11. If the anisotropic etching is performed on the substrate surface, the etching is slowly performed on a {111} plane as the etching rate of the anisotropic etching varies depending on the crystallographic orientation, and thus, a seed of the pyramid-shaped defects is generated. Even if the anisotropic etching is subsequently performed again, the seed of the pyramid defects are not removed by the anisotropic etching. In addition, as the isotropic etching has the etching rate which is not relevant to the crystallographic orientation, even if the isotropic etching is performed after the anisotropic etching, it is estimated that the substrate has a surface-rounding effect, but the pyramid-shaped defects or the defect seeds are not completely removed.

In embodiments of the present disclosure, when the isotropic etching is performed first, the crystalline silicon substrate has a round-shaped surface due to an etching rate of the isotropic etching irrespective of crystallographic orientations. Therefore, in contrast to the anisotropic etching, if the isotropic etching is performed first, a seed of pyramid-shaped defects does not occur on the substrate surface. Thereafter, when the anisotropic etching is performed, the rounded surface of the substrate has different etching rates according to the crystallographic orientations. As a result, a stepped portion caused by the saw mark on the surface of the final crystalline silicon substrate is also greatly flattened (or the surface roughness is improved) In addition, no pyramid-shaped defects were observed on the surface of the final substrate because the seeds of the pyramid-shaped defects were not formed by the isotropic etching which is initially performed.

According to the above embodiments of the present disclosure, the crystalline silicon substrate having purity of 99.999% to 99.9999% and having flat both surfaces (e.g., a first surface and a second surface) with no texture, and no pyramid-shaped defects on the surface thereof

[Method for Manufacturing Tandem Solar Cell]

According to the present disclosure, a tandem solar cell has a two-terminal tandem solar cell structure. The two-terminal solar cell is formed by tunnel-bonding a first solar cell including an absorption layer with a relatively large band gap and a second solar cell including an absorption layer with a relatively small band gap through a middle layer.

In this configuration, among a light incident on the tandem solar cell, a light in a short-wavelength region is absorbed by the first solar cell disposed at an upper portion thereof to generate an electric charge and a light in a long-wavelength region passing through the first solar cell is absorbed by the second solar cell disposed at a lower portion thereof to generate an electric charge.

The tandem solar cell having the above-described structure absorbs the light in the short-wavelength region by the first solar cell disposed at the upper portion thereof to generate electricity and absorbs the light in the long-wavelength region by the second solar cell disposed at the lower portion thereof to generate electricity. Therefore, a threshold wavelength may be moved toward the long wavelength to widen an entire wavelength band absorbed by the solar cell.

For the tandem solar cell in the present disclosure, solar cells that may be used as the first solar cell and the second solar cell includes, as non-limiting examples, a perovskite solar cell and a crystalline silicon solar cell. However, the first solar cell in the present disclosure is not limited to the perovskite solar cell and the second solar cell is not limited to the crystalline silicon solar cell. For the tandem solar cell in the present disclosure, any solar cell may be used if the upper solar cell has a greater band gap than the band gap of the lower solar cell.

Hereinafter, for convenience of explanation, features of the present disclosure with respect to a tandem solar cell including a perovskite solar cell and a crystalline silicon solar cell are described.

FIGS. 12 to 21 show a method for manufacturing a tandem solar cell according to an embodiment of the present disclosure.

Figure 12:
FIGS. 12 to 21 are schematic views showing a method for manufacturing a tandem solar cell using a crystalline silicon substrate according to an embodiment of the present disclosure.

A tandem solar cell in the present disclosure was manufactured using a substrate flattened by performing SDE on a front surface and a rear surface of a crystalline silicon substrate 111 according to Comparative Examples and Embodiments of the present disclosure (see FIG. 12). It is notified in advance that remaining subsequent processes except for the etching process performed on the substrate in Embodiments and Comparative Examples were performed under the same conditions.

Figure 13:
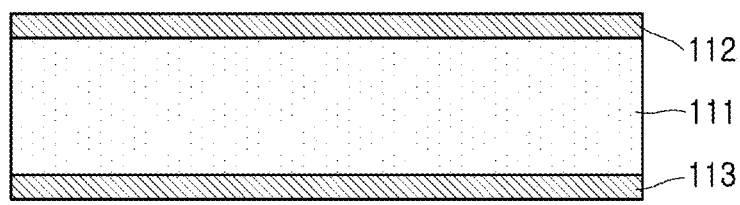

As shown in FIG. 13, the first passivation layer 112 is disposed on a first surface of the crystalline silicon substrate 111 and a second passivation layer 113 is disposed on a second surface of the crystalline silicon substrate 111. In this case, the passivation layers 112 and 113 may be formed only on the first surface of the crystalline silicon substrate 111, and then formed on the second surface thereof. Alternatively, the passivation layers 112 and 113 may be simultaneously formed on the first surface and the second surface of the crystalline silicon substrate 111.

The passivation layers 112 and 113 may also be deposited by plasma enhanced chemical vapor deposition (PECVD). In particular, when the passivation layers 112 and 113 are sequentially formed on the first surface and the second surface of the crystalline silicon substrate 111, the PECVD or thermal oxidation may be performed.

As an example method for manufacturing the passivation layers 112 and 113 in the present disclosure, amorphous intrinsic silicon (i-a-Si:H) layers were deposited by the PECVD using a silicon source material (e.g., $SiH_4$, $Si_2H_6$) and hydrogen ($H_2$) to manufacture the passivation layers 112 and 113 formed at both sides of an n-type silicon crystalline substrate 111 having flat surface.

Figure 14:
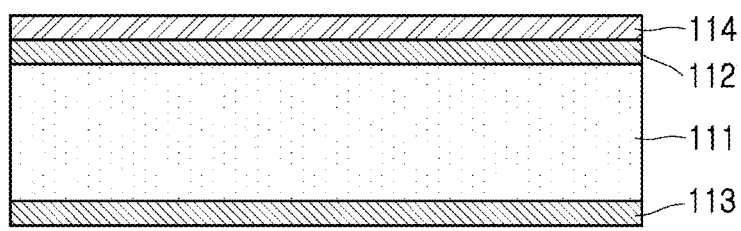
Figure 15:
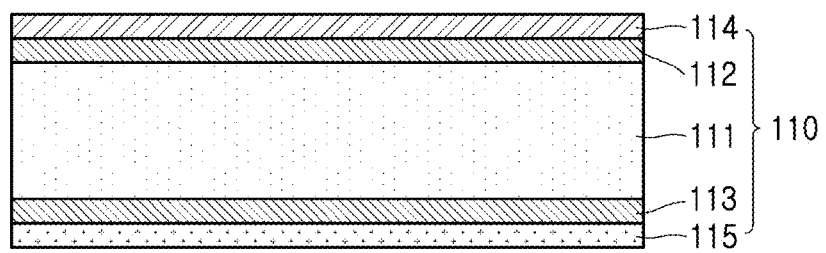

After the passivation layers 112 and 113 are formed, a first semiconductor type layer 114 is formed on the passivation layer 112 and a second semiconductor type layer 115 is formed on the passivation layer 113 (see FIGS. 14 and 15)

According to the present disclosure, the first semiconductor type layer 114 formed above the crystalline silicon substrate 111 may be different from the semiconductor type silicon substrate 111 or may be the same as the semiconductor type silicon substrate.

For example, when the crystalline silicon substrate 111 is an n-type single crystal silicon substrate, the first semiconductor type layer 114 is a p-type semiconductor layer. Similarly, when the crystalline silicon substrate 111 is a p-type single crystal silicon substrate, the first semiconductor type layer 114 is an n-type semiconductor layer.

For example, when the crystalline silicon substrate 111 is an n-type single crystal silicon substrate, the first semiconductor type layer 114 may also be an n-type semiconductor layer.

For example, the first semiconductor type layer and the second semiconductor type layer were formed using at least one gas selected from the group consisting of $SiH_4$, $SiH_6$, $SiHCl_3$ and $SiH_2Cl_2$, $H_2$ gas, and dopant gas such as $B_2H_6$ or $PH_3$ gas, as a reactant, through the PECVD process. In this case, temperature and pressure conditions of the PECVD process may be the same as those of the amorphous intrinsic silicon layer.

For a homojunction silicon solar cell, the first semiconductor type layer 114 and the second semiconductor type layer 115 may each be formed through an ion implantation process without the passivation layers 112 and 113.

For example, when the first semiconductor type layer 114 is an emitter layer, boron is doped as a dopant and the second semiconductor type layer 115 is a rear electric field layer and is doped with phosphorous.

When the first semiconductor type layer 114 and the second semiconductor type layer 115 are each formed by the ion implantation process as described above, it is advantageous to perform heat treatment at 700 to 1,200° C. for activation of impurities. In addition, the first semiconductor type layer 114 and the second semiconductor type layer 115 may each be formed through a high temperature diffusion process using $BBr_3$ or $PCl_3$ instead of the ion implantation process.

Figure 16:
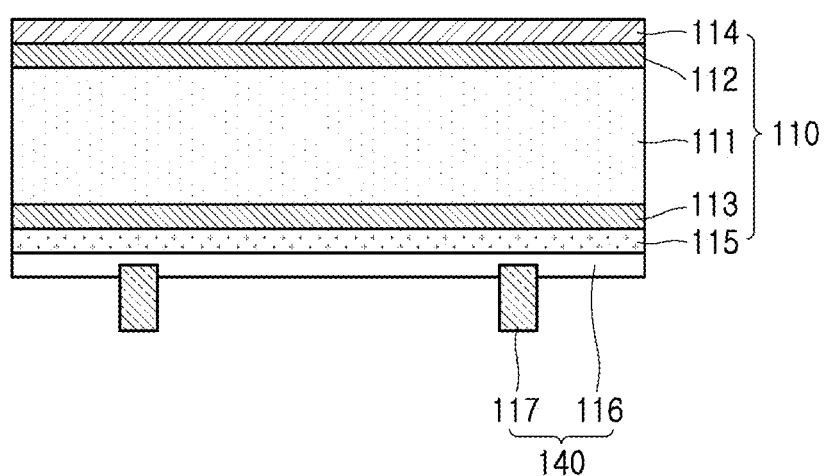

As shown in FIG. 16, a second electrode 140 is formed on the second semiconductor type layer 115.

As described above, for the heterojunction silicon solar cell, a process temperature of the second electrode 140 is limited to equal to or less than 250° C., similar to the process temperature of the first electrode 150, to prevent destruction of hydrogen bonds inside the amorphous silicon. In this case, the second electrode 140 may be formed before the first electrode 150 or the second electrode 140 and the first electrode 150 may be formed at the same time.

A second transparent electrode layer 116 of the second electrode 140 is disposed on the second semiconductor type layer 115. When a transparent electrode layer is made of transparent conductive oxide such as indium tin oxide (ITO), zinc indium tin oxide (ZITO), zinc indium oxide (ZIO), and zinc tin oxide (ZTO), the second transparent electrode layer 116 may be deposited through sputtering.

After the second transparent electrode layer 116 is formed, a second metal electrode layer 117 is formed. The second metal electrode layer 117 may be formed directly under the second semiconductor type layer 115 without forming the second transparent electrode layer 116. However, a metal grid has a small contact area with the amorphous silicon and the amorphous silicon has relatively low carrier mobility, and thus, the metal grid may be difficult to collect the carriers. Therefore, the second transparent electrode layer 116 is advantageous to be formed on the second semiconductor type layer 115.

In this case, the second metal electrode layer 117 is formed by printing a second electrode paste on the second transparent electrode layer 116 by a screen printing method and heat-treating with a second temperature (that is the same as the first temperature).

The second electrode 140 may be manufactured by selectively applying a second electrode paste that does not contain a glass frit and then low-temperature sintering at a second temperature. The second electrode paste may contain metal particles and a low-sintering organic binder material and the second electrode paste does not contain glass frit. In particular, the second temperature may be equal to or less than 250° C., for example, 100 to 200° C.

Figure 17:
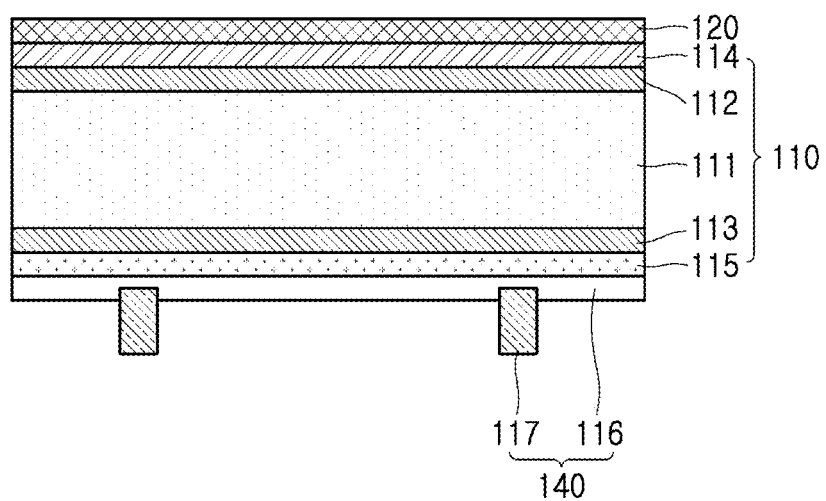

A middle layer 120 is formed on the first semiconductor type layer 114 of the second solar cell 110 to electrically connect the first solar cell 130 and the second solar cell 110 (see FIG. 17).

A transparent conductive material is deposited on the middle layer 120 in the present disclosure. In the present disclosure, the middle layer 120 is formed on the substrate using a widely-known sputtering method, for example, RF magnetron sputtering. For example, fluorine tin oxide (FTO) was deposited to form the second transparent electrode layer 116 and aluminum doped zinc oxide (AZO) was used for the middle layer 120, but the present disclosure is not limited thereto. In addition, various transparent conductive oxides, metallic materials, and conductive polymers may also be used.

Figure 18:
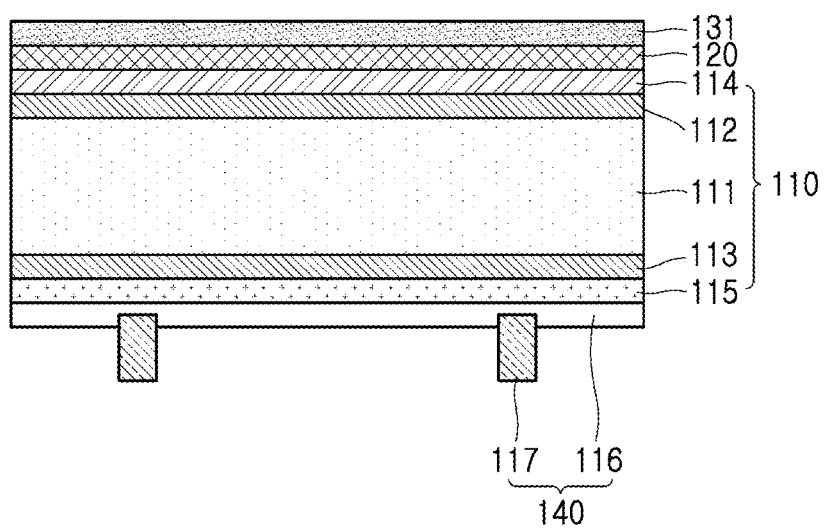

A second semiconductor type charge transport layer 131 is formed on the middle layer 120 (see FIG. 18). As described above, the second semiconductor type charge transport layer 121 may be a p-type hole transport layer or an n-type electron transport layer depending on the structure of the second solar cell 110 and the first semiconductor type layer 114 and the second semiconductor type layer 115.

When the first semiconductor type charge transport layer 121 is an electron transport layer, $C_{60}$ was prepared using a solution method as a specific example material of the electron transport layer in the present disclosure.

The solution process in the related art, mentioned in the present disclosure, refers to a process such as inkjet printing, gravure printing, spray coating, doctor blade, bar coating, gravure coating, brush painting, and slot-die coating.

As a specific example, a fullerene derivative containing $C_{60}$ is dissolved in a solvent and spin-coated for 10 to 30 seconds using the spin coating method, and then maintained at room temperature for 1 to 3 hours to form an electron transport layer.

For example, when the second semiconductor type charge transport layer 131 is a p-type hole transport layer, in the present disclosure, Spiro-OMeTAD was prepared as the p-type hole transport layer material using the solution method in the related art.

As a specific example, a hole transport material (HTM) consisting of 45.7 mM of 2,2',7,7'-tetrakis(N,N-p-dimethoxyphenylamine)-9,9'-spirofluorene(spiro-OMeTAD, Merck), 220 mM of 4-tert-butylpyridine(TBP, Aldrich, 96%), and 20 mM of bis(trifluoromethane)sulfonimide lithium salt ($LiClO_4$, Aldrich, 99.95%) in 1 mL of anhydrous chlorobenzene (Aldrich, 99.8%) was coated over the first semiconductor type charge transport layer 121 to form a hole transport layer.

Figure 19:
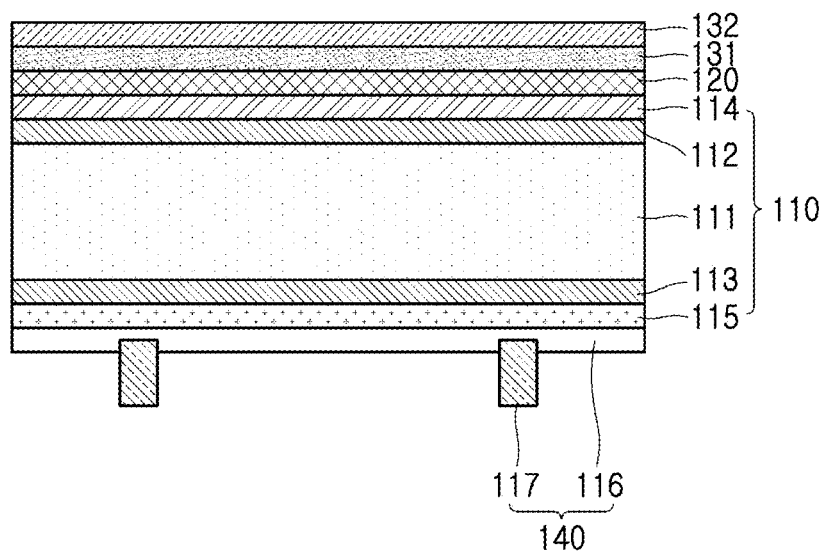

As shown in FIG. 19, a perovskite absorption layer 132 is formed on the second semiconductor type charge transport layer 131.

The perovskite absorption layer 132 in the present disclosure may be made of methylamminium (MA)-based or formamidinium (FA)-based perovskite compounds that are widely used. In addition, example method of forming the perovskite absorption layer 132 in the present disclosure may include a thin film process in addition to the solution process in the related art.

The solution process has an advantage in that the solution process is a simple, easy, and inexpensive process of applying and drying solution and is used to form a light absorber of a photoactive layer. In addition, there is an advantage in that crystallization is spontaneously performed by drying the applied solution to form the light absorber of coarse grains, and for example, the perovskite light absorber has excellent electron conductivity and hole conductivity.

For example, the solution process may have difficulty in forming a perovskite absorption layer with the same thickness while maintaining the texture shape under the perovskite absorption layer 132, due to inherent characteristics of the solution process. Therefore, there is a possibility that the characteristics of the tandem solar cell may be deteriorated due to deviations in thickness and shape.

In the present disclosure, as a specific example, a perovskite absorption layer 132 including a material having a formula of $FA_{1-x}Cs_xPbBr_yI_{3-y}$ (where $0 \leq x \leq 1$ and $0 \leq y \leq 3$) was formed on the second semiconductor type charge transport layer 131.

In the present disclosure, an inorganic material layer was coated on the second semiconductor type charge transport layer 131. The inorganic material layer in the present disclosure was prepared by the solution method using $PbI_2$. 4 mmol of $PbI_2$ (Sigma-Aldrich, 99%) was dissolved in 4 ml of N,N-dimethylformamide (DMF) (Sigma-Aldrich, 99.8%) to prepare a $PbI_2$ solution. Then, 40 ml of the $PbI_2$ solution was rotated for 30 seconds at a speed of 500 to 5,000 rpm on the substrate on which the second semiconductor type charge transport layer 131 was formed by spin coating to coat the inorganic material layer. Then, the substrate coated with the inorganic material layer was dried at 100° C. for 15 minutes.

Subsequently, an organic material layer was coated on the inorganic material layer. The substrate coated with the inorganic material layer was immersed using a 0.01 g/ml of $(CH(NH_2)_2)Br$ solution in 2-propanol (Sigma-Aldrich, 99.5%), rotated at a maximum of 3,000 rpm for 30 seconds, and then dried at 100° C. for 15 minutes.

For example, the perovskite absorption layer 132 in the present disclosure is formed by physical vapor deposition or chemical vapor deposition using sputtering or electron beam, in addition to the above solution process. In this case, the perovskite absorption layer may be formed by single step deposition or sequential step deposition and the sequential step is preferable due to the difficulty in manufacturing the uniform thin film using the single step.

In the present disclosure, after forming the perovskite absorption layer 132 as described above, a post-heat treatment process was performed to change components of the perovskite absorption layer 132 into the perovskite material. The post-heat treatment process is performed within about 3 hours at a temperature range of room temperature to 200° C. A lower limit of the post-heat treatment temperature is not particularly limited, and if it is higher than 200° C., the polymer material of the perovskite absorption layer may be thermally degraded. In addition, in the case of the deposition process, before the precursor layers react with each other to form a perovskite layer, each of precursor layers may be thermally decomposed or a composition change thereof may occur due to the thermal decomposition.

Figure 20:
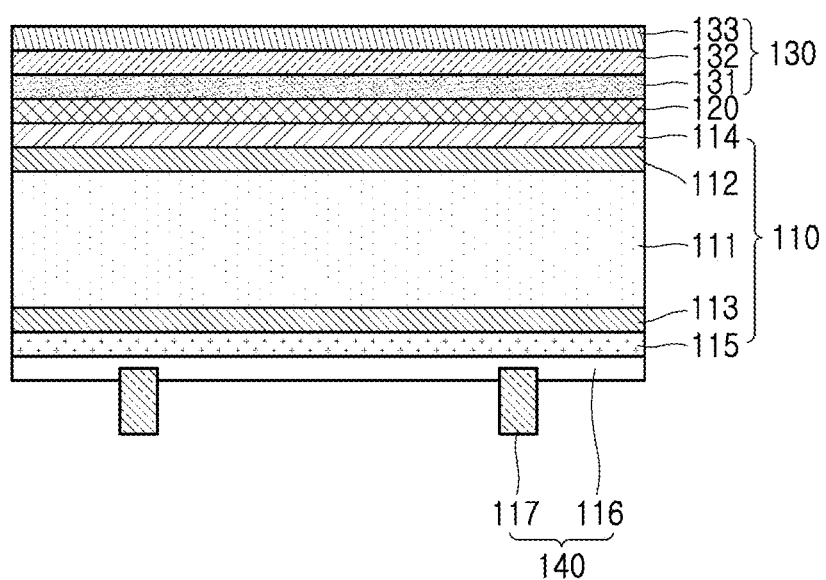

As shown in FIG. 20, a first semiconductor type charge transport layer 133 is formed on the perovskite absorption layer 132.

As described above, if the second conductivite charge transport layer 131 is an n-type electron transport layer, the first semiconductor type charge transport layer 133 is a p-type hole transport layer. For example, the second semiconductor type charge transport layer 131 is a p-type hole transport layer, the first semiconductor type charge transport layer 133 may be the n-type electron transport layer.

Figure 21:
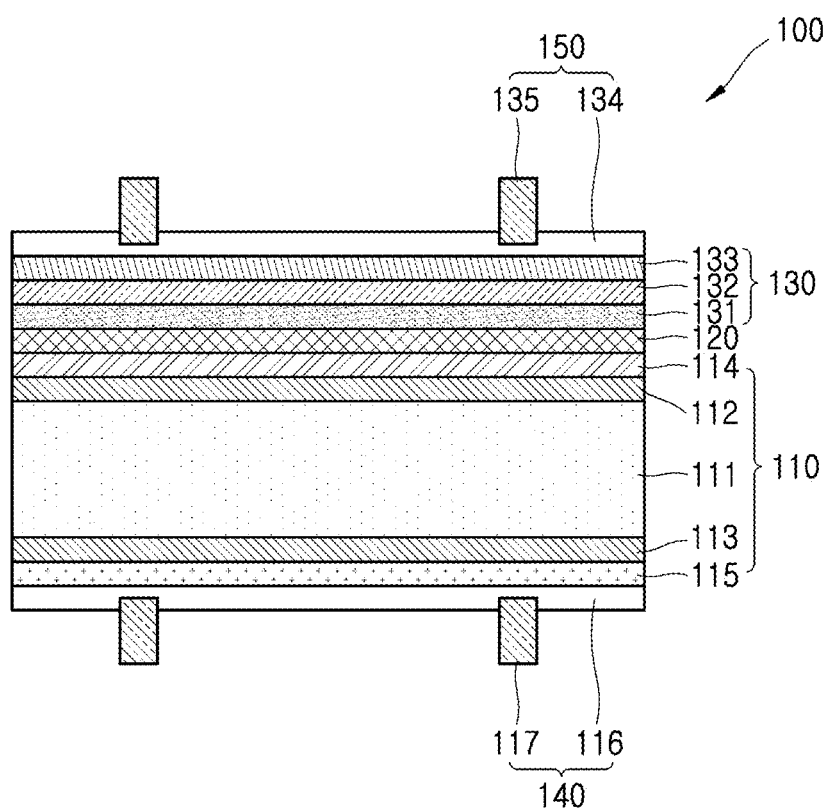

After the first semiconductor type charge transport layer 133 is formed as described above, a first transparent electrode layer 134 of a first electrode 150 is formed in the present disclosure (see FIG. 21).

In this case, the first transparent electrode layer 134 is formed on an entire upper surface of the perovskite solar cell 130 and functions to collect electric charges generated by the perovskite solar cell 130. The first transparent electrode layer 134 may be made of various transparent conductive materials, similar to the second transparent electrode layer 116 described above.

In this case, the first metal electrode layer 135 of the first electrode 150 is disposed on the first transparent electrode layer 134 and is disposed in a partial region of the first transparent electrode layer 134.

The first metal electrode layer 135 of the first electrode 150 may be manufactured by selectively applying a first electrode paste not containing a glass frit and then low-sintering at a first temperature. The first electrode paste may contain metal particles and a low-sintering organic binder material and the first electrode paste does not contain glass frit. In particular, the first temperature may be equal to or less than 250° C., for example, 100 to 200° C. to protect the perovskite absorption layer 132 vulnerable to heat from a subsequent high-temperature process.

[Evaluation of Characteristics of Tandem Solar Cells]

Figure 22:
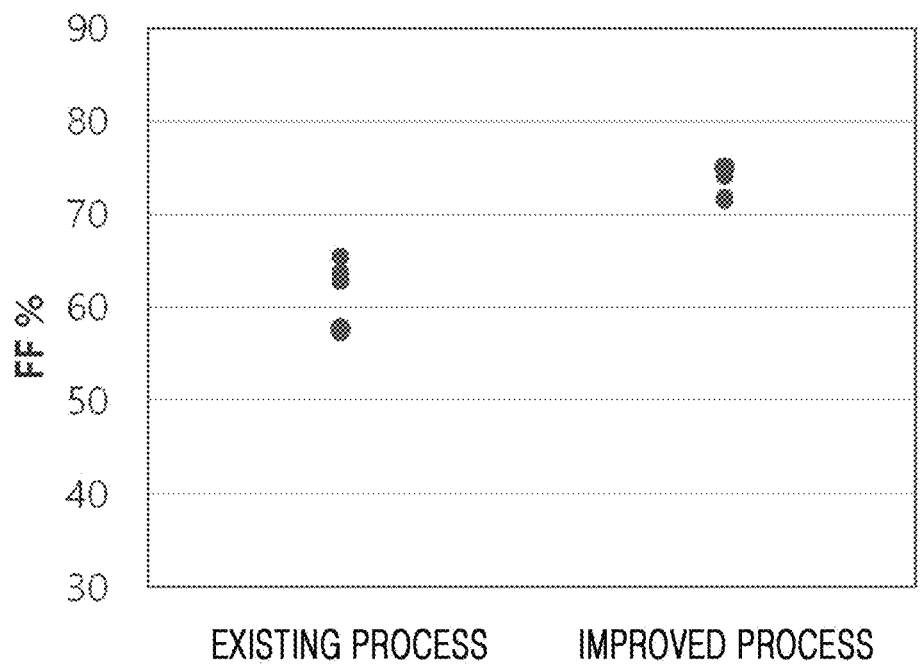
FIG. 22 shows a result of evaluating a fill factor (FF) of a tandem solar cell manufactured by an SDE method using a crystalline silicon substrate in Embodiments and Comparative Examples of the present disclosure.

FIG. 22 shows a result of evaluating a fill factor (FF) of a tandem solar cell manufactured by manufacturing methods in FIGS. 13 to 22 using a crystalline silicon substrate which is etched using SDE methods in embodiments and comparative examples of the present disclosure.

The FF of the solar cell refers to a ratio of an actual output of a solar cell to maximum capacity thereof.

In this case, the maximum capacity of the solar cell is determined as a product of Jsc and Voc. Jsc is a short circuit current density and refers to a current flowing when both electrodes of the solar cell are directly connected or an instantaneous maximum current that may flow through the solar cell. In addition, Voc is an open circuit voltage and refers to a voltage when nothing is connected to the solar cell or a maximum voltage of the solar cell (current is "0").

Referring to FIG. 22, it may be seen that the tandem solar cell manufactured using the SDE method according to the embodiment of the present disclosure has an improved FF by about 10% or more compared to the tandem solar cell using the SDE method according to the comparative example.

The tandem solar cell using the SDE method in the comparative example has pyramid-shaped defects present on the surface of the crystalline silicon substrate, and due to the defects, a perovskite unit layer is locally thinned around the defects. Therefore, it was found that the tandem solar cell using the SDE method in comparative example has inferior FF characteristics due to the defects on the final substrate surface.

By contrast, the tandem solar cell using the SDE method in the embodiment of the present disclosure has a uniform and defect-free crystalline silicon substrate surface. Therefore, it was found that the tandem solar cell of the present disclosure has excellent FF characteristics as the perovskite unit layer may be subsequently, uniformly coated.

Although the present disclosure has been described as described above, the present disclosure is not limited to the embodiments and drawings, and various modifications can be made by those skilled in the art within the scope of the technical idea of the present disclosure. Further, even if working effects obtained based on configurations of the present disclosure are not explicitly described in the description of embodiments of the present disclosure, effects predictable based on the corresponding configuration have to be recognized.

The invention claimed is:

1. A method for manufacturing a tandem solar cell, the method comprising:
    preparing a crystalline silicon substrate;
    performing a first isotropic etching process of the crystalline silicon substrate;
    removing a saw damage on a surface of the crystalline silicon substrate by performing an anisotropic etching process of the isotropically etched crystalline silicon substrate;
    performing a second isotropic etching of the crystalline silicon substrate after the anisotropic etching;
    positioning a second solar cell on the crystalline silicon substrate from which the saw damage is removed and is flattened;
    positioning a middle layer on the second solar cell; and
    positioning a first solar cell on the middle layer.

2. The method for manufacturing the tandem solar cell of claim 1, wherein the first and second isotropic etching processes are performed using an acid.

3. The method for manufacturing the tandem solar cell of claim 2, wherein the acid is a mixed acid with nitric acid ($HNO_3$) and hydrofluoric acid (HF), and has a mixing ratio of 100:1 to 10:1.

4. The method for manufacturing the tandem solar cell of claim 1, wherein the anisotropic etching process is performed using an alkali.

5. The method for manufacturing the tandem solar cell of claim 4, wherein the alkali is 1 to 10% by weight of a sodium hydroxide aqueous solution.

6. The method for manufacturing the tandem solar cell of claim 3, wherein an etching solution including the acid further comprises at least one additive of an organic solvent, a phosphate, a reaction modifier, or a surfactant.

7. The method for manufacturing the tandem solar cell of claim 1, wherein an anisotropic etching process time of the anisotropic etching process is 5 to 10 minutes.

8. The method for manufacturing the tandem solar cell of claim 1, wherein the crystalline silicon substrate from which the saw damage is removed has no pyramid-shaped defect.

9. The method for manufacturing the tandem solar cell of claim 1, wherein the first solar cell has a band gap that is greater than a band gap of the second solar cell.

10. The method for manufacturing the tandem solar cell of claim 9, wherein the first solar cell is a perovskite solar cell and the second solar cell is a crystalline silicon solar cell.

11. The method for manufacturing the tandem solar cell of claim 1, wherein an isotropic etching process time of the first and second isotropic etching processes is longer than or equal to an anisotropic etching process time of the anisotropic etching time.

12. The method for manufacturing the tandem solar cell of claim 1, wherein a process temperature of each of the first and second isotropic etching processes and the anisotropic etching process is room temperature to approximately 150° C.

13. The method for manufacturing the tandem solar cell of claim 8, wherein the pyramid-shaped defect before removal has a width and a height of approximately 1 µm to 100 µm.

14. The method for manufacturing the tandem solar cell of claim 1, wherein the second solar cell is positioned on a flat substrate of the crystalline silicon substrate from which the saw damage is removed and is with no texture.

15. The method for manufacturing the tandem solar cell of claim 1, wherein the second solar cell comprises a first semiconductor type layer and a second semiconductor type layer.

16. The method for manufacturing the tandem solar cell of claim 15, wherein at least one of the first semiconductor type layer or the second semiconductor type layer comprises an amorphous silicon layer.

17. The method for manufacturing the tandem solar cell of claim 9, wherein the first solar cell comprises a perovskite absorption layer with a material having a formula of $FA_{1-x}Cs_xPbBr_yI_{3-y}$, where $0 \leq x \leq 1$ and $0 \leq y \leq 3$.

18. A method for manufacturing a tandem solar cell, the method comprising:
    providing a crystalline silicon substrate having saw damage from being cut into wafers by a saw wire;
    performing a saw damage etching process without generating a plurality of pyramid-shaped defects,
    wherein the saw damage etching process comprises a first isotropic etching process of the crystalline silicon substrate, an anisotropic etching process of the isotropically etched crystalline silicon substrate, and a second isotropic etching process of the crystalline silicon substrate after the anisotropic etching process;
    positioning a second solar cell on the crystalline silicon substrate from which the saw damage is removed and is flattened;
    positioning a middle layer on the second solar cell; and
    positioning a first solar cell on the middle layer.

* * * * *